US012719499B2

(12) United States Patent
Yan et al.

(10) Patent No.: US 12,719,499 B2
(45) Date of Patent: Aug. 25, 2026

(54) MANAGEMENT OF COMPRESSED DATABASE SEGMENTS USING MULTIPLE COMPRESSION TECHNIQUES

(71) Applicant: TigerGraph, Inc., Redwood City, CA (US)

(72) Inventors: Jin Yan, Sammamish, WA (US); Liang Zhang, Wayland, MA (US); Songting Chen, Portola Valley, CA (US)

(73) Assignee: TigerGraph, Inc., Redwood City, CA (US)

( * ) Notice: Subject to any disclaimer, the term of this patent is extended or adjusted under 35 U.S.C. 154(b) by 146 days.

(21) Appl. No.: 18/307,948

(22) Filed: Apr. 27, 2023

(65) Prior Publication Data

US 2024/0364361 A1 Oct. 31, 2024

(51) Int. Cl.
*H03M 7/30* (2006.01)
*G06F 16/174* (2019.01)

(52) U.S. Cl.
CPC ...... *H03M 7/3084* (2013.01); *G06F 16/1744* (2019.01)

(58) Field of Classification Search
CPC ......................... H03M 7/3084; G06F 16/1744
See application file for complete search history.

(56) References Cited

U.S. PATENT DOCUMENTS 5,392,036 A * 2/1995 Klein ...................... H03M 7/30 341/51
5,406,281 A * 4/1995 Klayman ................ G06T 9/005 341/51
5,663,721 A * 9/1997 Rossi .................. H03M 7/3084 341/95
5,771,011 A * 6/1998 Masenas ............ H03M 7/3086 341/51
6,192,259 B1 * 2/2001 Hayashi ................ H04W 88/02 455/72
7,283,072 B1 * 10/2007 Plachta ............... H03M 7/3088 341/87
7,420,992 B1 * 9/2008 Fang ................... H04L 12/4633 375/240
7,554,464 B1 * 6/2009 Oberdorfer ............. H03M 7/30 341/55
7,609,179 B2 * 10/2009 Diaz-Gutierrez ....... H03M 7/40 341/51
7,649,909 B1 * 1/2010 Archard ............. H04L 12/4633 370/477
9,390,099 B1 * 7/2016 Wang .................... H03M 7/707
10,318,483 B2 * 6/2019 Kataoka ........... G06F 16/90344

(Continued)

*Primary Examiner* — Debbie M Le
*Assistant Examiner* — Huen Wong

(57) ABSTRACT

Systems, methods, and software described herein generate and manage a compressed database using a dictionary and a Huffman data structure. In one implementation, a method includes determining a frequency that each string of a plurality of strings in a segment of a database appears in the segment. The method further provides for identifying a first subset of strings with the highest frequency of appearance in the data structure and generating a dictionary for the first subset of strings. The method also includes generating a Huffman data structure based on the frequencies associated with the plurality of strings and generating a compressed segment based on the dictionary and the Huffman data structure.

20 Claims, 5 Drawing Sheets

(56) References Cited

U.S. PATENT DOCUMENTS

2002/0063641 A1* 5/2002 Fish .................... H03M 7/3086 341/87
2002/0078241 A1* 6/2002 Vidal ...................... H04L 69/04 709/231
2002/0101605 A1* 8/2002 Zeck ...................... H04N 19/93 375/E7.203
2003/0048207 A1* 3/2003 Nelson .................... G06T 9/005 341/51
2007/0229323 A1* 10/2007 Plachta ............... H03M 7/3088 341/51
2008/0162517 A1* 7/2008 Iyer ..................... H03M 7/3088
2009/0271180 A1* 10/2009 Balegar ............... H03M 7/3088 704/10
2011/0016138 A1* 1/2011 Teerlink .............. G06F 16/1744 707/E17.014
2012/0023073 A1* 1/2012 Dean ..................... G06F 16/355 707/693
2012/0254190 A1* 10/2012 Kataoka .............. G06F 16/2237 707/741
2012/0254333 A1* 10/2012 Chandramouli ........ G06F 40/10 709/206
2013/0103982 A1* 4/2013 Chelliah ............. H03M 7/3088 714/E11.147
2013/0204527 A1* 8/2013 Schilling ............ G01C 21/3446 701/533
2014/0059075 A1* 2/2014 Kataoka .............. G06F 16/2246 707/769
2015/0193462 A1* 7/2015 Kataoka ............ G06F 16/90344 707/693
2016/0092492 A1* 3/2016 Zimmer .............. H03M 7/6076 707/693
2016/0226516 A1* 8/2016 Kataoka ................ H03M 7/405
2019/0109869 A1* 4/2019 Bailey ................... G06F 21/554
2019/0377804 A1* 12/2019 Wu ................... G06F 16/90335

* cited by examiner

MANAGEMENT OF COMPRESSED DATABASE SEGMENTS USING MULTIPLE COMPRESSION TECHNIQUES

BACKGROUND

Databases are organized collections of structured information, or data, that can be stored across one or more physical devices and computers. The data can include integers, strings, or some other values associated with different organizations, operations, services, or some other set of information. For example, a social network can maintain one or more databases that are used to define information about users (names, ages, interests, etc.) and relationships between the users (friendships, work relationships, etc.). The databases that store the information can comprise relational databases that store data in one or more tables with rows and columns to represent the data, graph databases that use vertices and edges to represent the data, or some other type of database.

As the amount of data increases within the databases, difficulties arise in managing the data and the amount of storage device required to store the required information. Specifically, as big data becomes more common place, data can be stored across large segments (divisions of a database) that can be difficult to compress and manage. Additionally, while compressing the database can reduce the overall storage requirement for a database, difficulties can arise and in searching and performing other queries associated with the information in the database.

Overview

Provided herein are systems and methods for compression of a database using multiple compression techniques for strings in the database. In one implementation, a management service determines a frequency that different strings appear within a segment of the database. The management service further identifies a subset of the strings with the highest frequency of appearance and generates a dictionary for the subset of strings that associates a key with each string in the subset of strings. The management service further generates a Huffman data structure based on the frequencies of appearance within the segment. Once the dictionary and the Huffman data structure are generated, the management service generates a compressed segment using the dictionary and the Huffman data structure.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Figure 1:
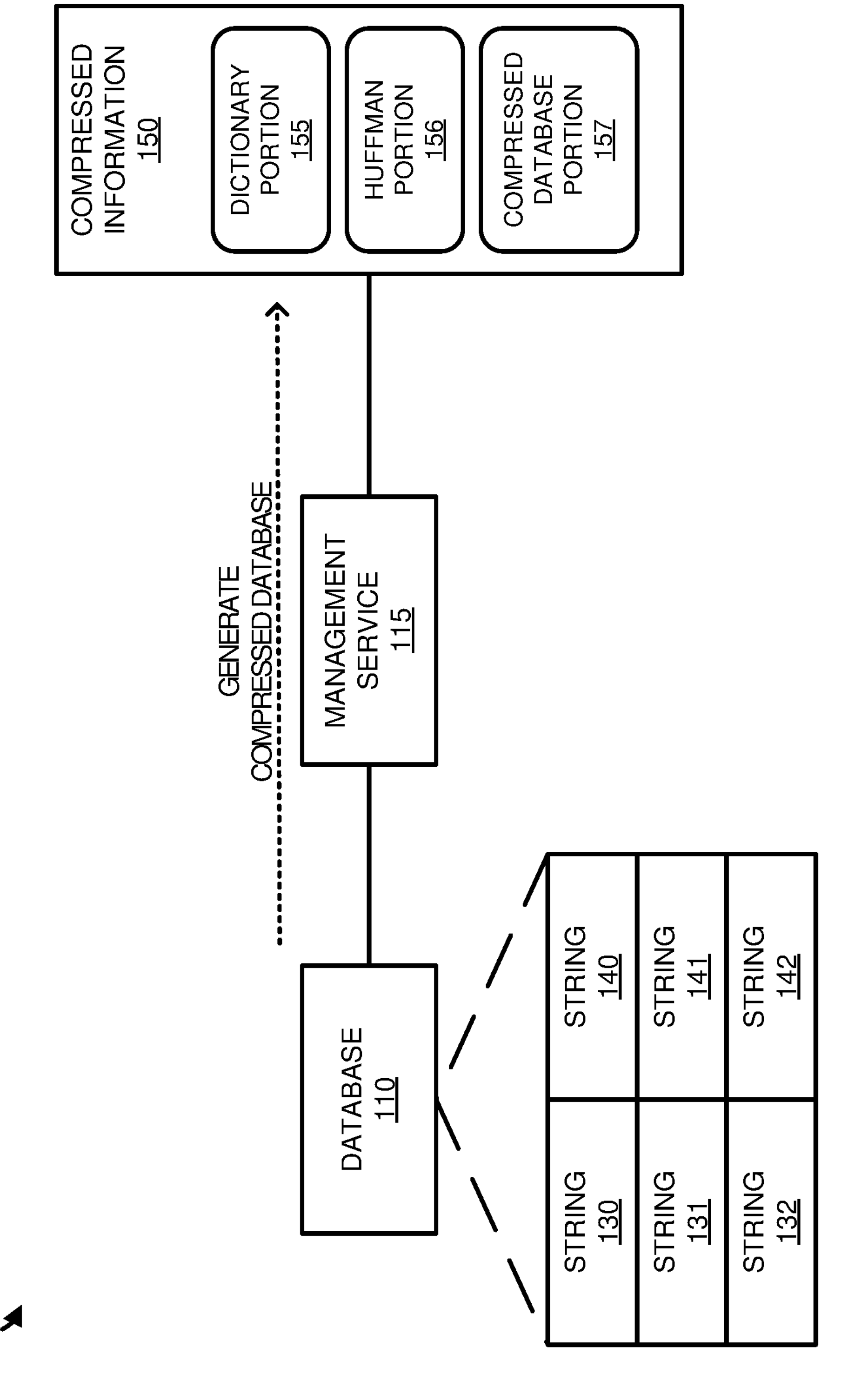
FIG. 1 illustrates a system for creating and managing a compressed database according to an implementation.

FIG. 1 illustrates a system 100 for creating and managing a compressed database according to an implementation. System 100 includes database 110, management service 115, and compressed database 150. Database 110 includes strings 130-132 and strings 140-142. Compressed database 150 includes dictionary portion 155, Huffman portion 156, and compressed database portion 157. Although demonstrated with six strings in the example portion of database 110, database 110 can include any number of strings. Further, while described in the examples here in as compressing an entire database, similar operations could be performed on one or more segments of a database. For example, a database may comprise thousands of segments of a particular data size (e.g., two gigabytes). Each of the segments can be compressed in a similar manner to the operations described herein, wherein each of the segments can be compressed individually.

In system 100, database 110 can represent a relational database, a graph database, or some other type of database capable of providing an organized collection of structured information. Database 110 can be stored on one or more storage devices, such as hard drives, solid state drives, or some other storage media, and can be stored across multiple computing systems, such as servers, desktop computers, or some other computing system. The information represented in database 110 can include information for a social network, banking or commerce information, human resource information, medical records, or some other information. As the amount of information in database 110 increases, an administrator associated with database 110 can direct management service 115 to generate a compressed information 150 that provides a compressed version of database 110.

Here, compressed information 150 comprises dictionary portion 155, Huffman portion 156, and compressed database portion 157. Dictionary portion 155 is used to represent the most frequently represented or appearing strings within database 110, wherein dictionary portion 155 will map unique keys to the most frequently used strings of database 110. For example, an entry within dictionary portion 155 can comprise a unique key such as “0011” that represents string 130 from database 110. The unique key can then be used to replace string 130 in compressed database portion 157, wherein dictionary portion 155 can be used to translate the key back to the original and vice versa to respond to a query of the graph. In some implementations, dictionary portion 155 can comprise a maximum quantity of entries. Thus, only the maximum quantity of strings with the highest frequency will be included as part of dictionary portion 155.

In addition to dictionary portion 155, compressed information 150 further includes Huffman portion 156 that is representative of a Huffman data structure to compress information for the strings from database 110. A Huffman data structure is used for lossless data compression that assigns variable-length codes to input characters (e.g., letters and other symbols in the strings). The variable lengths are assigned based on the frequencies of the corresponding characters. Thus, a first character would be assigned a first location in the data structure based on the frequency of the first character in the strings, while a second character would be assigned a second location in the data structure based on the frequency of the second character in the strings. The more frequently occurring characters would be associated with a smaller quantity of bits, while characters occurring less would be represented by a larger quantity of bits. In some examples, the frequency of the characters can be taken from sampling the strings in database 110 rather than testing all the strings within database 110. In some examples, the most frequently used strings (i.e., the strings in the dictionary) will not be used in determining the frequency of the characters for the generation of Huffman portion 156. From the Huffman portion 156, characters from the strings can be replaced with the corresponding code from Huffman portion 156 and the replaced strings (i.e., Huffman compressed strings) can be used in compressed database portion 157.

In some examples, only a subset of the strings from database 110 can be represented using dictionary portion 155 and Huffman portion 156. In these instances, the strings that include characters that are not represented in Huffman portion 156 can be compressed using Lempel-Ziv-Welch (LZW) compression. Specifically, when a string includes a character that is not included as part of Huffman portion 156, the string can be compressed using LZW compression and stored in compressed database 157, wherein the LZW compressed version of the string will replace the original string in compressed database portion 157.

Figure 2:
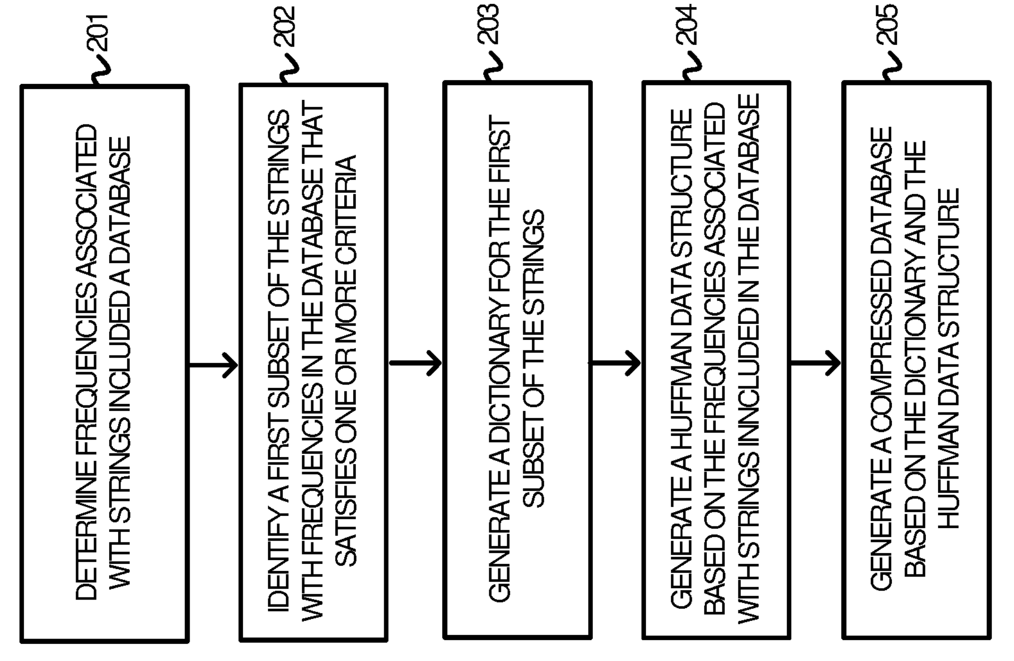
FIG. 2 illustrates a method of creating a compressed database according to an implementation.

FIG. 2 illustrates a method 200 of creating a compressed database according to an implementation. The steps of method 200 are referenced parenthetically in the paragraphs that follow with reference to systems and elements of system 100 of FIG. 1. Method 200 can be implemented using management service 115, wherein management service 115 can be implemented using one or more computers. The computers can comprise desktop computers, server computers, or some other computing system.

Method 200 includes determining (201), for a plurality of strings in a database, a frequency that each string of the plurality of strings appears in the database. In some implementations, the method can consider each string in database 110, wherein management service 115 can identify the frequency that each string in database 110 is present. In other implementations, the method can sample portions of database 110 to identify the frequency that different strings appear within database 110. The sample size can be a percentage of the overall size of the database, a quantity of entries in the database, or some other subset of the database. In monitoring the frequency, management service 115 can use bloom filters, hashing, heap size, or other mechanisms to process and identify the frequency of the various strings. The frequency of the strings can also be used to identify the frequency of individual characters that are used in the development of Huffman portion 156 in compressed information 150.

In some implementations, in determining the frequency of the different strings, method 200 can employ count-min-sketches that sample at least a portion of database 110 to identify the frequency of the strings in the database. The count-min sketches are probabilistic data structures that serve as a frequency table of values in a stream of data. Specifically, a count-min sketch data structure uses hash functions to map value (or string) frequencies. Unlike a hash table that uses a single hash function, the count-min sketch data structure uses multiple hash functions that each correspond to a different portion, such as a column, in the data structure. From the created count-min sketch data structure, method 200 can determine the frequency of the different strings and identify the strings with a frequency that satisfies one or more criteria (i.e., highest frequency) for the dictionary. Additionally, a separate count can be maintained in association with the different symbols present within the strings (i.e., characters). Thus, when each string is identified in the sampling for the frequencies of the strings, the character frequency can be updated based on the characters that are present within the strings. This can be used in association with the Huffman codex described further in step 204 below.

After determining the frequency associated with each string of a plurality of strings in database 110, method 200 further includes identifying (202) a first subset of strings in the plurality of strings with frequencies in the database that satisfies one or more criteria. In some examples, management service 115 may identify a quantity of strings with the highest frequency in database 110. For example, if 2,000 strings were processed by management service 115, management service 115, can identify the 250 most frequently occurring strings in the database. After the first subset of strings are identified, method 200 also provides for generating (203) a dictionary for the first subset of strings. The dictionary, represented in system 100 as dictionary portion 155, associates each string in the first subset with a unique key. The unique keys are then used to replace each of the corresponding keys in the compressed database. Thus, rather than including the full string, the unique key that can be shorter in total data, can be used as a replacement of the full string.

In addition to generating the dictionary, method 200 also includes generating (204) a Huffman data structure based on the frequencies associated with the plurality of strings. The Huffman data structure is generated based on the frequency of the individual characters within the strings of database 110. Specifically, in addition to the frequencies associated with the various strings identified during step 201, management service can further identify the frequencies for each of the characters within the strings. The Huffman data structure can permit characters with a higher frequency to be promoted In the data structure (i.e., tree), while the characters with a lower frequency can be placed lower in the data structure. For example, a first character with a higher frequency can be assigned a value of “1” while a second character with a lower frequency can be assigned a value of “1011.” In some implementations, the frequencies associated with the characters can be determined from the strings that were not included as part of the dictionary. However, in other examples, the frequencies associated with the characters can be calculated from all the strings that were sampled from database 110.

Further, in addition to generating the dictionary and the Huffman data structure, method 200 also includes generating (205) a compressed database based on at least the dictionary and Huffman data structure. In generating the compressed data structure, management service 115 can traverse database 110 and replace the strings with a corresponding compressed version. When a string corresponds to an entry in the dictionary, the unique key associated with the string can be used in the compressed database. However, when the string is not in the dictionary, the Huffman data structure can be used to determine the compressed version of the string. Specifically, the original character bits (e.g., ASCII character bits) in the string can be replaced with the bits defined in the Huffman data structure, wherein the most frequently used characters in the database are assigned a short bit value and less frequently used characters in the database are assigned a larger bit value. Accordingly, strings with more frequently used characters can be assigned a shorter length of overall bits in compressed database portion 157.

In at least one implementation, strings can include one or more characters that are not represented in Huffman portion 156. In this example, rather than determining the compressed version of the string using the Huffman data structure, management service 115 can use Lempel-Ziv-Welch (LZW) compression to determine the compressed version of the string. The LZW compressed version of the string can then be stored in the compressed database portion 157 representing the string. Additionally, when applying Huffman portion 156 to a string from database 110, if the resultant compressed string is longer than the original string, management service 115 can apply LZW compression to the original string instead to generate the compressed version of the string for compressed database portion 157.

In some implementations, when a string is not present in dictionary portion 155, management service 115 can first determine whether the string is over a threshold length. If the string is over the threshold length (e.g., 15 bytes), management service 115 can implement Huffman data structure application described above (and LZW compression if required). Alternatively, if the string is not over a threshold length, the string can be stored in a short raw form that limits the requirement of processing by management service 115.

In storing the compressed versions of the strings in compressed database portion 157, the strings can include a prefix or other identifier that indicates the type of compression that was used in generating the compressed string. For example, entries in compressed database portion 157 that used the dictionary portion 155 will include a first identifier, entries in compressed database portion 157 that used Huffman portion 156 will include a second identifier, entries in compressed database portion 157 that used LZW compression will include a third identifier, and entries that used the raw short version of the strings will include a fourth identifier. Thus, when read during a query, the entries can be converted back to the original string based on the identifier.

In some examples, bloom filters or other types of filters can be used to determine whether a string is stored as part of the dictionary. For example, when adding a string to the compressed version of the database, a hash can be applied to the string to determine one or more values. The one or more values can be compared to a bloom filter generated from hashes of the strings in the dictionary to determine whether the one or more values are present in the bloom filter. If the one or more values are not present, then the string is not represented in the dictionary. Alternatively, if the one or more values are present, then the dictionary can be searched for the string and the corresponding key.

Although demonstrated in method 200 as compressing an entire database, method 200 can be used to compress one or more segments of a database. For example, a database can comprise 1,000 segments, and one or more segments of the 1,000 segments can be compressed using the operations of method 200. Each segment can be compressed individually or can be compressed in groups of two or more of the segments.

Figure 3:
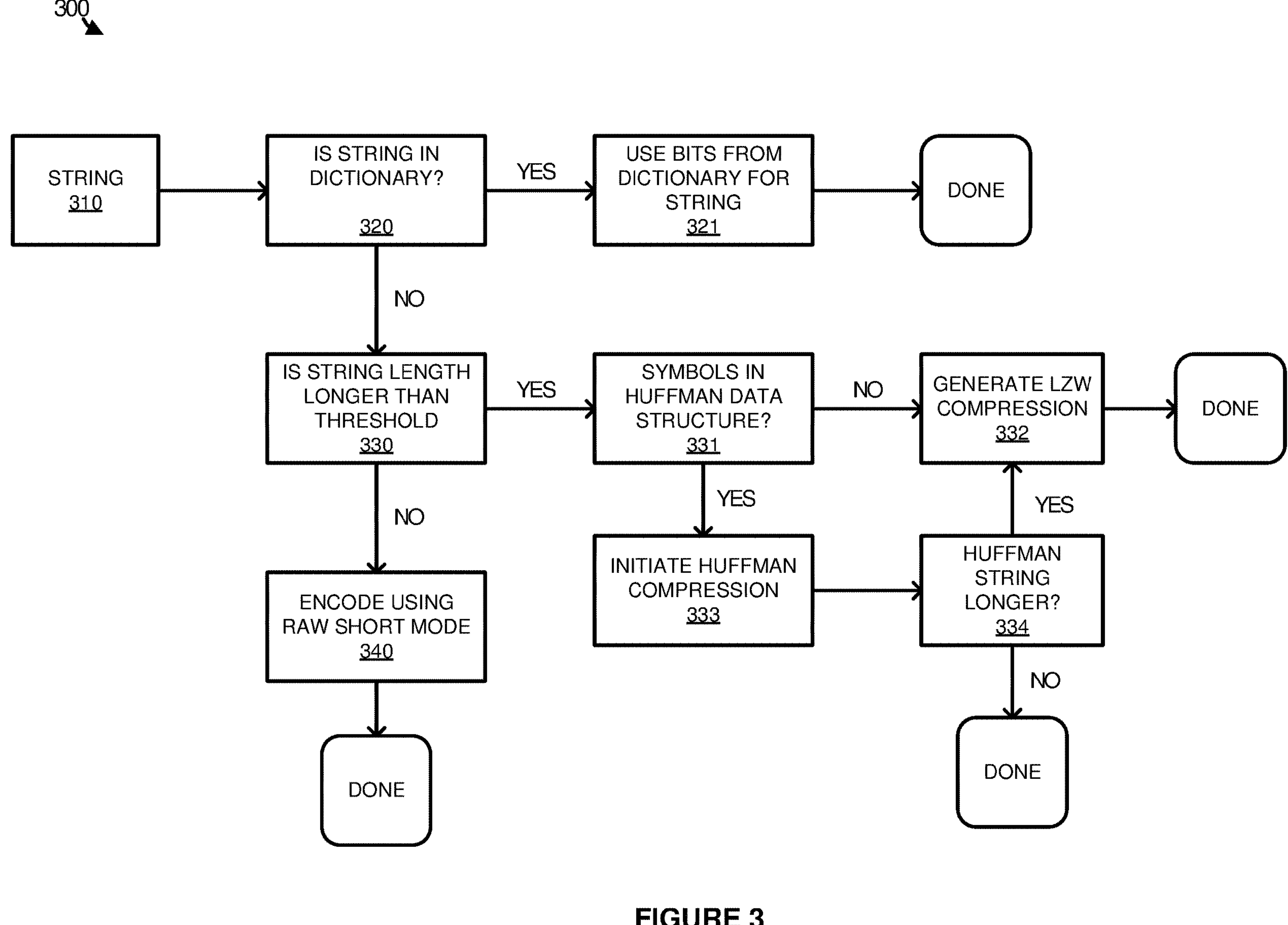
FIG. 3 illustrates an operational scenario of determining a code representation of a string for a database according to an implementation.

FIG. 3 illustrates an operational scenario 300 of determining a code representation of a string for a database according to an implementation. Operational scenario 300 is representative of operations performed by a management service, such as management service 115. Operational service 115 includes string 310, and operations 320-321, 330-334, and 340.

In operational scenario 300, string 310 is identified by a management system to be compressed and placed into a compressed database. Once identified, operation 320 is performed to determine whether string 310 is represented in a dictionary for the compressed database. The dictionary is generated based on the frequency that different strings are identified within the original database. In some implementations, the frequency is determined by processing the frequency associated with the entire database, however, the frequency can be sampled in some examples, using random or pseudorandom entries within the original database. From the frequencies associated with the different strings, the strings with the highest frequency of occurrence will be used to generate the dictionary, wherein the dictionary associated each of the high frequency strings with a unique key or identifier. For example, the 200 most frequently occurring strings can be identified from a database and used for the dictionary.

When string 310 is represented in the database, the management service applies operation 321 that uses bits from the dictionary to represent the string in the compressed database, wherein the bits comprise the key associated with string 310. In contrast, when string 310 is not represented in the dictionary, operation 330 is performed to determine whether the length of the string is longer than a threshold length. For example, a threshold length can be set to 15, wherein strings that fall below this threshold can have operation 340 performed that encodes the string in raw short mode for the compressed database. The raw short mode will not perform compression on the string but will instead store the string as-is in the compressed database.

If the string length is longer than the threshold, operation 331 is performed that determines whether the symbols or characters in the string are present in the Huffman data structure. If the symbols are in the Huffman data structure, then operation 331 is performed that initiates Huffman compression using the Huffman data structure. The Huffman data structure is used to associate different characters with a unique identifier based on the frequency that each of the characters were identified in the database. For example, a first character will have a first frequency that corresponds to a first value and a second character will have a second frequency that corresponds to a second value. If a character is not present in the sampled strings from the database, then the character will not be represented in the Huffman data structure. Instead, when a character is not represented in the Huffman data structure, operation 332 is performed that will generate a LZW compression version of the string. LZW compression is used to convert or translate strings into a smaller quantity of bits. The LZW compressed version of string 310 is then used in representing string 310 in the compressed database.

In some implementations, if the Huffman data structure does include all the symbols from string 310, operation 333 is performed that initiates Huffman compression that identifies bit values from the Huffman data structure for the string, wherein the bit values are combined to provide a compressed version of string 310. Once the compressed string is identified, operation 334 is initiated that determines whether the Huffman string is longer or includes more data than the original string 310. If the compressed version of the string from the Huffman data structure is shorter than original string 310, then the Huffman compressed version of the string is used in the compressed data structure. Alternatively, if the compressed version of the string from the Huffman data structure is longer than original string 310 then LZW compression is used on string 310 to determine the compressed version. The compressed version is then stored in the compressed data structure. In some examples, the comparison of the Huffman compressed string length to the original version is not performed by the management service. Instead, the Huffman compressed version of the string will be stored as the compressed version of the string.

In some implementations, when string 310 is compressed using the dictionary, Huffman data structure, raw short form, or LZW compression, the string is labeled to identify the type of compression that was used. Specifically, bits can be added to the entry in the compressed database to indicate the type of compression that was used for the compressed string. Thus, when a conversion is required to place the compressed string back to its original form, the management service can identify the type of compression that was used and convert the data back to the original form.

In some implementations, the generation of the dictionary and the Huffman data structure is based on a sample portion of the database. For example, 20 percent of the database can be sampled to determine the frequencies associated with the different strings and the frequencies can be used to define the dictionary and Huffman data structure. As the database is updated, the frequencies associated with the different strings can change. Accordingly, the frequencies can be resampled to identify the frequencies associated with the different strings. The resampling can occur periodically, based on the quantity of changes to the database, based on an administrator request, or at some other interval. Once the frequencies are recalculated, the dictionary and Huffman data structure can be updated, and the compressed database can be updated using the new dictionary and Huffman data structure.

Figure 4:
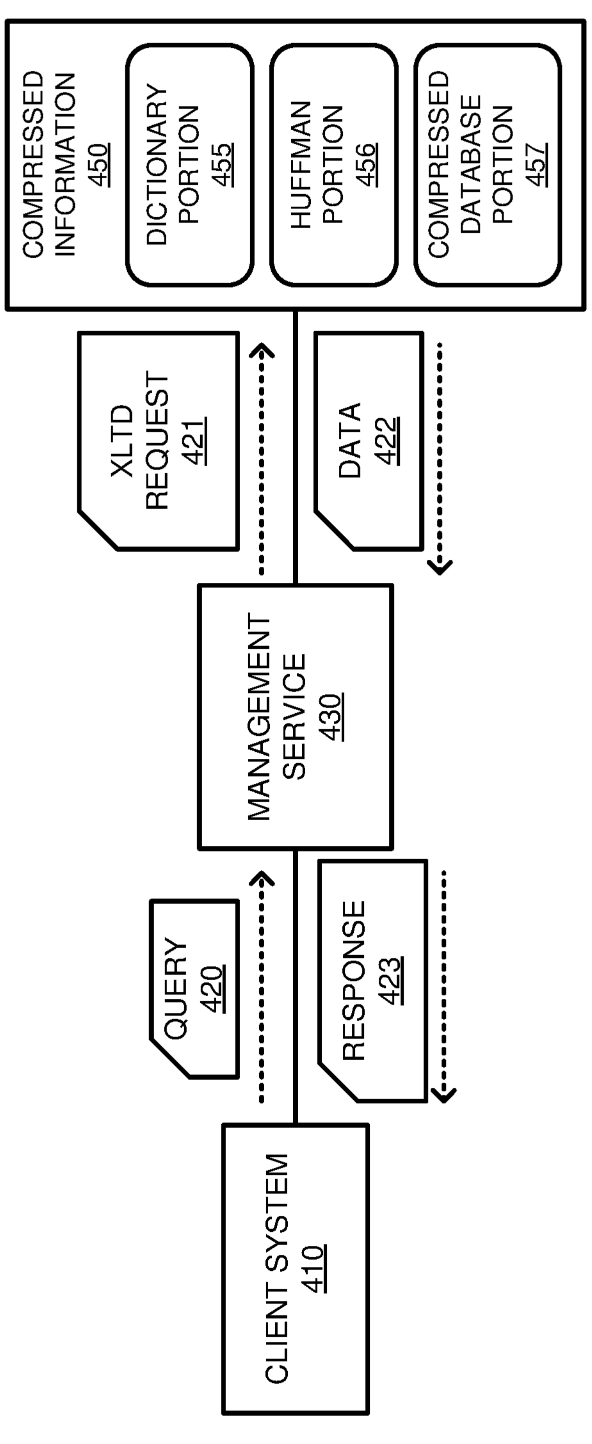
FIG. 4 illustrates an operational scenario of managing a query to a compressed database according to an implementation.

FIG. 4 illustrates an operational scenario 400 of managing a query to a compressed database according to an implementation. Operational scenario 400 includes client system 410, management service 430, and compressed information 450. Operational scenario 400 further includes query 420, translated request 421, data 422, and response 423. Compressed information 450 further includes dictionary portion 455, Huffman portion 456, and compressed database portion 457.

As described herein, to generate a compressed version of a database, a management service, such as management service 430 can identify the frequencies associated with different strings represented in the database. Based on the frequencies, management service 430 can generate a dictionary that is represented as dictionary portion 455, a Huffman data structure that is represented has Huffman portion 456, and compressed database portion 457 that includes the compressed strings generated based on at least the dictionary and the Huffman data structure. After generating compressed information 450, client system 410 can generate a query 420 to the compressed database, wherein the query can include a string from the original database. In response to identifying the query, management service 430 can generate translated request 421 that is used to identify the relevant information in compressed database portion 457. The query can be used to identify relationship between fields (e.g., users of a social network in a particular location, wherein the location can be represented as a string), the frequency that a particular string is present within the data structure, or some other query to the data structure. The query can include a single string or can include multiple strings in some examples.

In generating translated request 421, management service 430 can first determine whether a string included as part of query 420 is in the dictionary. If the string is represented in the dictionary, management service 430 will translate the string to the corresponding key and search the compressed database portion 457 for the required value. If the string is not represented in the dictionary, management service 430 can determine whether to use the Huffman data structure in Huffman portion 456 to identify the compressed version of the string. In some examples, management service 430 will first determine whether the string exceeds a threshold length. If the string does not exceed the threshold length, then the string can be stored in the compressed data structure in raw short form and the string can be searched in the raw short form. If the string does exceed the threshold length, then management service 430 will determine if the characters of the string are represented in Huffman portion 456. If the characters are represented, a compressed version of the string can be identified using the Huffman data structure and a search can be performed using the compressed version of the string. Alternatively, if the characters are not present in the string, management service 430 can perform LZW compression on the string to identify the compressed version of the string and search compressed database portion 457. In some examples, LZW compression will also be used with the Huffman compressed version of a string is longer than the original version of the string.

After applying the translated request 421 to compressed database portion 457 to identify the desired data 422, management service 430 generates a response 423 to the query based on data 422. For example, the query can request the quantity of times that a particular string appears within a field of the data structure (e.g., location) and response 423 can indicate the desired quantity.

Figure 5:
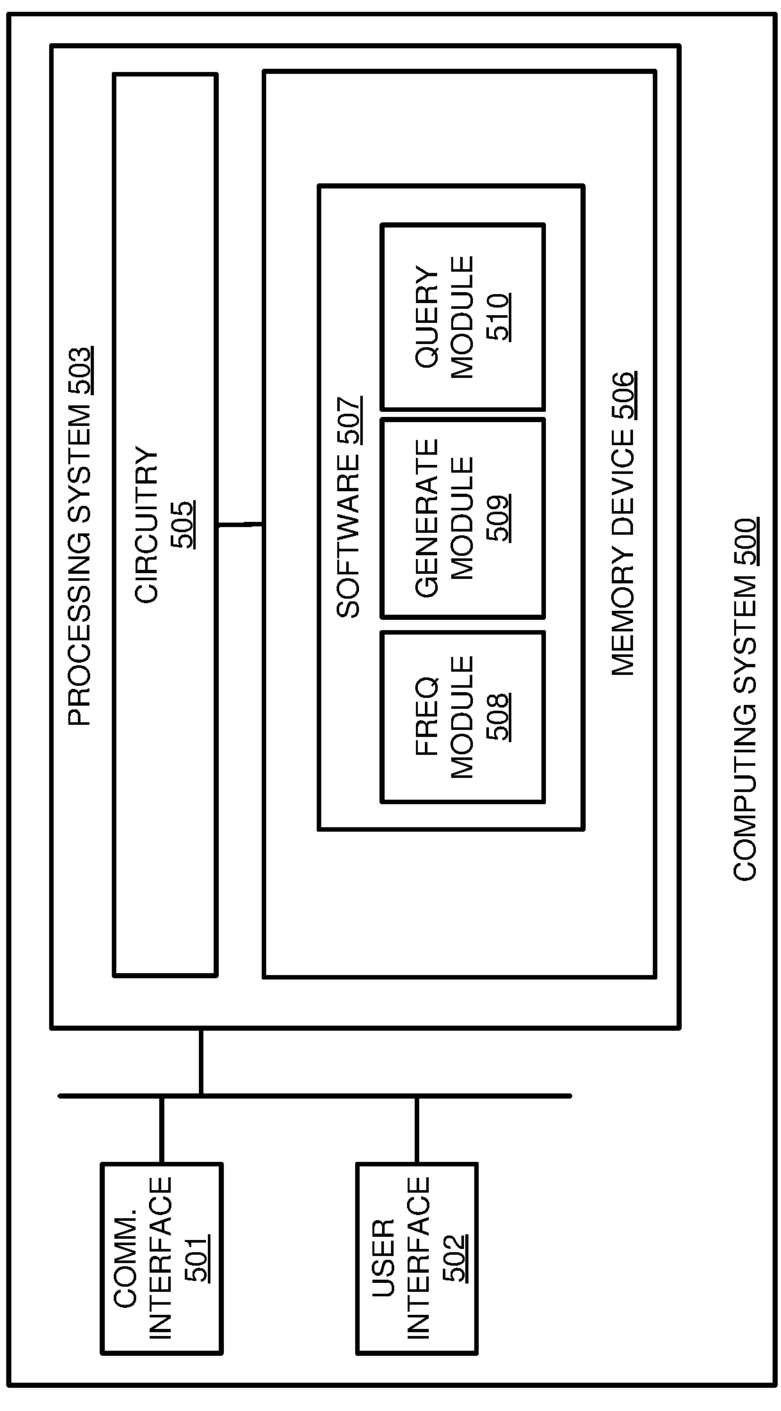
FIG. 5 illustrates a computing system to create and manage a compressed database according to an implementation.

FIG. 5 illustrates a computing system 500 to create and manage a compressed database according to an implementation. Computing system 500 is representative of any computing system or systems with which the various operational architectures, processes, scenarios, and sequences disclosed herein for a management service. Computing system 500 may be representative of a management service 115 of FIG. 1 or management service 430 of FIG. 4, although other examples may exist. Computing system 500 comprises communication interface 501, user interface 502, and processing system 503. Processing system 503 is linked to communication interface 501 and user interface 502. Processing system 503 includes processing circuitry 505 and memory device 506 that stores operating software 507. Computing system 500 may include other well-known components such as a battery and enclosure that are not shown for clarity.

Communication interface 501 comprises components that communicate over communication links, such as network cards, ports, radio frequency (RF), processing circuitry and software, or some other communication devices. Communication interface 501 may be configured to communicate over metallic, wireless, or optical links. Communication interface 501 may be configured to use Time Division Multiplex (TDM), Internet Protocol (IP), Ethernet, optical networking, wireless protocols, communication signaling, or some other communication format—including combinations thereof. In at least one implementation, communication interface 501 may be configured to communicate with client computing systems, wherein the client computing systems may provide queries for various query operations. Communication interface 501 may also be configured to communicate with one or more computing systems that provide storage for a database to process an original database and generated a compressed version of the database.

User interface 502 comprises components that interact with a user to receive user inputs and to present media and/or information. User interface 502 may include a speaker, microphone, buttons, lights, display screen, touch screen, touch pad, scroll wheel, communication port, or some other user input/output apparatus—including combinations thereof. User interface 502 may be omitted in some examples.

Processing circuitry 505 comprises microprocessor and other circuitry that retrieves and executes operating software 507 from memory device 506. Memory device 506 may include volatile and nonvolatile, removable, and non-removable media implemented in any method or technology for storage of information, such as computer readable instructions, data structures, program modules, or other data. Memory device 506 may be implemented as a single storage device but may also be implemented across multiple storage devices or sub-systems. Memory device 506 may comprise additional elements, such as a controller to read operating software 507. Examples of storage media include random access memory, read only memory, magnetic disks, optical disks, and flash memory, as well as any combination or variation thereof, or any other type of storage media. In some implementations, the storage media may be a non-transitory storage media. In some instances, at least a portion of the storage media may be transitory. In no case is the storage media a propagated signal.

Processing circuitry 505 is typically mounted on a circuit board that may also hold memory device 506 and portions of communication interface 501 and user interface 502. Operating software 507 comprises computer programs, firmware, or some other form of machine-readable program instructions. Operating software 507 includes frequency module 508, generate module 509, and query module 510, although any number of software modules may provide a similar operation. Operating software 507 may further include an operating system, utilities, drivers, network interfaces, applications, or some other type of software. When executed by processing circuitry 505, operating software 507 directs processing system 503 to operate computing system 500 as described herein.

In one implementation, frequency module 508 directs processing system 503 to determine frequencies associated with strings in a database. The frequencies can be determined from sampling a portion of the strings in a database or from determining the frequencies of all strings in the database. For example, the frequencies can be estimated by sampling 20 percent of the strings within the database. After the frequencies are identified for different strings in the database, generate module 509 directs processing system 503 to identify a first subset of strings of the strings in the database with frequencies in the database that satisfy one or more criteria. For example, the dictionary could be configured to support a maximum quantity of entries. As a result, generate module 509 will direct processing system 503 to identify the maximum quantity strings with the highest frequency for the dictionary. The subset of strings is then entered into the dictionary, wherein each of the strings is associated with a unique key to replace the corresponding key in the compressed version of the database.

In addition to generating the dictionary, generate module 509 further directs processing system 503 to generate a Huffman data structure based on the frequencies associated with the plurality of strings. The Huffman data structure is used to promote the characters or symbols that are most frequently used in association with the strings. For example, a first character that is frequently used may be represented by a smaller quantity of bits in the Huffman data structure than a second character that is less frequently used. Characters that were not identified in the strings may not be identified or included within the Huffman data structure.

Once the dictionary and the Huffman data structure are generated, generate module 509 directs processing system 503 to create a compressed database based on at least the dictionary and the Huffman data structure. In creating the compressed database, generate module 509 will identify a string to be added to the compressed data structure and determine whether the string is represented in the dictionary. If represented, the key associated with the string will be used as a replacement value for the string in the compressed data structure. If not represented in the dictionary, generate module 509 will determine whether the string satisfies one or more length criteria or a length threshold. If the length does not exceed the length threshold, then a raw short form of the string can be stored in the compressed database.

In contrast, if the length exceeds the length threshold, then generate module 509 will determine whether the characters included as part of the string are represented in the Huffman data structure. When all the characters are included in the Huffman data structure, generate module 509 will apply the Huffman data structure to determine a compressed version of the string. In some implementations, the Huffman data structure version of the string will be compared to the length of the original string to determine whether the length of the original string is longer than the Huffman compressed version. If the length of the Huffman compressed version is shorter, then the Huffman compressed version will be used for the compressed database. If the length of the Huffman compressed version is longer, then generate module 509 can employ LZW compression on the string. In some implementations, a string can include one or more characters that are not included in the Huffman data structure. For these strings, the strings can be compressed using LZW compression and the LZW compressed version can be stored as part of the compressed database.

In some implementations, when each of the strings are stored in the compressed database, the type of compression can be indicated using one or more bits with the string. The different bits, included as a prefix portion, suffix version, or other portion of the compressed string. For example, different bits could indicate that a compressed string is created via the dictionary, the Huffman data structure, LZW compression, or entered in the raw short. This can permit query module 510 to identify the appropriate conversion mechanism for the entry. Accordingly, bits associated with a first string can indicate that the string should be converted using the dictionary, while bits associated with a second string can indicate that the string should be converted using the Huffman data structure.

In at least one example, query module 510 directs processing system 503 to identify a query to the database, wherein the query includes at least one string in non-compressed form. In response to identifying the query, query module 510 directs processing system 503 to convert the string into compressed form. In converting the string, query module 510 can employ the operations described above to determine whether the compressed form is generated from the dictionary, the Huffman data structure, LZW compression, or raw short form. Once converted, query module 510 directs processing system 503 to identify the relevant information from the compressed database and provide a response to the query. The query can be used to identify the how often a string appears in the database or provide some other information from the database.

Although demonstrated herein as compressing a complete database, the compression operations can be used to compress one or more portions or segments of a database. For example, a database can comprise thousands of segments and each segment can be compressed as described herein. In some examples, the segments can also be grouped as two or more segments and compressed as described herein.

The included descriptions and figures depict specific implementations to teach those skilled in the art how to make and use the best option. For teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

What is claimed is:

1. A method comprising:

determining, for a plurality of strings in a segment of a database, a frequency that each string of the plurality of strings appears in the segment;

identifying a first subset of strings in the plurality of strings whose respective frequencies of appearance in the segment satisfy one or more criteria;

generating a dictionary comprising keys corresponding to the first subset of strings;

determining, for symbols in the plurality of strings, a frequency that each symbol of the symbols appears in the segment;

generating a Huffman data structure based on the frequencies that each symbol of the symbols appears in the segment;

for strings in the plurality of strings whose respective frequencies of appearance in the segment do not satisfy the one or more criteria, identifying a second subset of strings in the plurality of strings with corresponding codes in the Huffman data structure; and generating a compressed segment by replacing the first subset of strings in the plurality of strings with corresponding keys from the dictionary and replacing the second subset of strings with the corresponding codes in the Huffman data structure.

2. The method of claim 1, wherein identifying the first subset of strings comprises:

identifying a maximum quantity of strings to be represented in the dictionary;

identifying first strings of the plurality of strings with the highest frequencies of appearance in the segment, wherein a quantity of the first strings matches the maximum quantity of strings to be represented in the dictionary; and selecting the first strings as the first subset of strings.

3. The method of claim 1 further comprising:

identifying a string to be added to the segment;

updating the compressed segment based on at least the dictionary and the Huffman data structure.

4. The method of claim 1 further comprising:

obtaining a query comprising a first string;

translating the first string to a second format based on the dictionary; and generating a response to the query using the second format.

5. The method of claim 1, wherein determining, for the plurality of strings in the segment, the frequency that each string of the plurality of strings appears in the segment comprises:

identifying a sample set of strings from the plurality of strings in the segment; and determining, for the plurality of strings in the segment, the frequency that each string of the plurality of strings appears in the segment based on the sample set of strings.

6. The method of claim 1 further comprising:

identifying a string to be added to the segment;

determining that the string is in the dictionary; and when the string is in the dictionary, adding the string to the compressed segment using a unique key for the string from the dictionary.

7. The method of claim 1 further comprising:

identifying a string to be added to the segment;

determining that the string is not in the dictionary;

in response to determining that the string is not in the dictionary, determining whether the string exceeds a threshold length; and when the string does not exceed the threshold length, adding the string to the compressed segment as a raw short form of the string.

8. The method of claim 1 further comprising:

identifying a string to be added to the segment;

determining that the string is not in the dictionary;

in response to determining that the string is not in the dictionary, determining whether the string exceeds a threshold length;

when the string does exceed the threshold length, applying the Huffman data structure to the string to determine a compressed version of the string; and adding the compressed version of the string to the compressed segment.

9. The method of claim 1 further comprising:

identifying a string to be added to the segment;

determining that the string is not in the dictionary;

in response to determining that the string is not in the dictionary, determining whether the string exceeds a threshold length;

when the string does exceed the threshold length, determining whether all symbols in the string are in the Huffman data structure;

when the Huffman data structure does include all the symbols of the string, applying the Huffman data structure to generate a compressed version of the string;

when the Huffman data structure does not include all the symbols of the string, applying Lempel-Ziv-Welch (LZW) compression to generate the compressed version of the string; and adding the compressed version of the string to the compressed segment.

10. The method of claim 1 further comprising:

identifying a string to be added to the segment;

determining that the string is not in the dictionary;

in response to determining that the string is not in the dictionary, determining whether the string exceeds a threshold length;

when the string does exceed the threshold length, determining whether all symbols in the string are in the Huffman data structure;

when the Huffman data structure does include all the symbols of the string:

applying the Huffman data structure to generate a compressed version of the string;

determining whether the compressed version of the string exceeds a data size of the string;

when the compressed version of the string exceeds the data size of the string, applying Lempel-Ziv-Welch (LZW) compression to the string to generate a second compressed version of the string and adding the second compressed version of the string to the compressed segment;

when the Huffman data structure does not include all the symbols of the string:

applying LZW compression to generate the compressed version of the string;

adding the compressed version of the string to the compressed segment.

11. A computing apparatus comprising:

one or more non-transitory computer readable storage media;

a processing system operatively coupled to the one or more non-transitory computer readable storage media; and program instructions stored on the one or more non-transitory computer readable storage media that, when executed by the processing system, direct the computing apparatus to:

determine, for a plurality of strings in a segment of a database, a frequency that each string of the plurality of strings appears in the segment;

identify a first subset of strings in the plurality of strings whose respective frequencies of appearance in the segment satisfy one or more criteria;

generate a dictionary comprising keys corresponding to for the first subset of strings;

determine, for symbols in the plurality of strings, a frequency that each symbol of the symbols appears in the segment;

generate a Huffman data structure based on the frequencies that each symbol of the symbols appears in the segment;

for strings in the plurality of strings whose respective frequencies of appearance in the segment do not satisfy the one or more criteria, identify a second subset of strings in the plurality of strings with corresponding codes in the Huffman data structure; and generate a compressed segment by replacing the first subset of strings in the plurality of strings with corresponding keys from the dictionary and replacing the second subset of strings with the corresponding codes in the Huffman data structure.

12. The computing apparatus of claim 11, wherein to identify the first subset of strings, the program instructions direct the computing apparatus to:

identify a maximum quantity of strings to be represented in the dictionary;

identify first strings of the plurality of strings with the highest frequencies of appearance in the segment, wherein a quantity of the first strings matches the maximum quantity of strings to be represented in the dictionary; and select the first strings as the first subset of strings.

13. The computing apparatus of claim 11, wherein the program instructions further direct the computing apparatus to:

identify a string to be added to the segment;

update the compressed segment based on at least the dictionary and the Huffman data structure.

14. The computing apparatus of claim 11, wherein the program instructions further direct the computing apparatus to:

obtain a query comprising a first string;

translate the first string to a second format based on the dictionary; and generate a response to the query using the second format.

15. The computing apparatus of claim 14, wherein to determine, for the plurality of strings in the segment, the frequency that each string of the plurality of strings appears in the segment, the program instructions direct the computing apparatus to:

identify a sample set of strings from the plurality of strings in the segment; and determine, for the plurality of strings in the segment, the frequency that each string of the plurality of strings appears in the segment based on the sample set of strings.

16. The computing apparatus of claim 11, wherein the program instructions further direct the computing apparatus to:

identify a string to be added to the segment;

determine that the string is in the dictionary; and when the string is in the dictionary, add the string to the compressed segment using a unique key for the string from the dictionary.

17. The computing apparatus of claim 11, wherein the program instructions further direct the computing apparatus to:

identify a string to be added to the segment;

determine that the string is not in the dictionary;

in response to determining that the string is not in the dictionary, determine whether the string exceeds a threshold length; and when the string does not exceed the threshold length, add the string to the compressed segment as a raw short form of the string.

18. The computing apparatus of claim 11, wherein the program instructions further direct the computing apparatus to:

identify a string to be added to the segment;

determine that the string is not in the dictionary;

in response to determining that the string is not in the dictionary, determine whether the string exceeds a threshold length;

when the string does exceed the threshold length, apply the Huffman data structure to the string to determine a compressed version of the string; and add the compressed version of the string to the compressed segment.

19. The computing apparatus of claim 11, wherein the program instructions further direct the computing apparatus to:

identify a string to be added to the segment;

determine that the string is not in the dictionary;

in response to determining that the string is not in the dictionary, determine whether the string exceeds a threshold length;

when the string does exceed the threshold length, determine whether all symbols in the string are in the Huffman data structure;

when the Huffman data structure does include all the symbols of the string, apply the Huffman data structure to generate a compressed version of the string;

when the Huffman data structure does not include all the symbols of the string, apply Lempel-Ziv-Welch (LZW) compression to generate the compressed version of the string; and add the compressed version of the string to the compressed segment.

20. An apparatus comprising:

one or more non-transitory computer readable storage media; and program instructions stored on the one or more non-transitory computer readable storage media that, when executed by a processing system, direct the processing system to:

determine, for a plurality of strings in a segment, a frequency that each string of the plurality of strings appears in the segment;

identify a first subset of strings in the plurality of strings whose respective frequencies of appearance in the segment satisfy one or more criteria;

generate a dictionary comprising keys corresponding to for the first subset of strings;

determine, for symbols in the plurality of strings, a frequency that each symbol of the symbols appears in the segment;

generate a Huffman data structure based on the frequencies that each symbol of the symbols appears in the segment;

for strings in the plurality of strings whose respective frequencies of appearance in the segment do not satisfy the one or more criteria, identifying a second subset of strings in the plurality of strings with corresponding codes in the Huffman data structure; and generate a compressed segment by replacing the first subset of strings in the plurality of strings with corresponding keys from the dictionary and replacing the second subset of strings with the corresponding codes in the Huffman data structure.

* * * * *